United States Patent
Ding et al.

(10) Patent No.: US 7,564,319 B2
(45) Date of Patent: Jul. 21, 2009

(54) VERTICAL LC TANK DEVICE

(75) Inventors: Hanyi Ding, Essex Junction, VT (US); Kai D. Feng, Essex Junction, VT (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/859,850

(22) Filed: Sep. 24, 2007

(65) Prior Publication Data

US 2008/0012091 A1   Jan. 17, 2008

Related U.S. Application Data

(63) Continuation of application No. 11/161,929, filed on Aug. 23, 2005, now Pat. No. 7,323,948.

(51) Int. Cl.
*H03B 5/08* (2006.01)
*H01F 5/00* (2006.01)
*H01L 29/00* (2006.01)

(52) U.S. Cl. .......... 331/181; 331/67; 331/167; 331/177 V; 336/84 M; 336/200; 336/223; 336/232; 257/531

(58) Field of Classification Search .......... 331/67, 331/181, 117 R, 167, 177 V; 336/84 M, 200, 336/223, 232; 257/531
See application file for complete search history.

(56) References Cited

U.S. PATENT DOCUMENTS

| | | | |
|---|---|---|---|
| 5,959,522 A * | 9/1999 | Andrews | 336/200 |
| 6,100,770 A | 8/2000 | Litwin et al. | |
| 6,268,779 B1 | 7/2001 | van Zeijl | |
| 6,404,317 B1 * | 6/2002 | Mizoguchi et al. | 336/200 |
| 6,423,981 B1 | 7/2002 | Naylor | |
| 6,480,086 B1 * | 11/2002 | Kluge et al. | 336/200 |
| 6,486,534 B1 | 11/2002 | Sridharan et al. | |
| 6,529,720 B1 | 3/2003 | Jovenin et al. | |
| 6,535,095 B2 * | 3/2003 | Aoki et al. | 336/83 |
| 6,777,774 B2 | 8/2004 | Beng et al. | |
| 6,833,603 B1 | 12/2004 | Park et al. | |
| 7,088,195 B2 * | 8/2006 | Muramatsu et al. | 331/117 R |
| 2002/0084509 A1 | 7/2002 | Ballantine et al. | |
| 2003/0076210 A1 | 4/2003 | Gomez et al. | |
| 2004/0251978 A1 | 12/2004 | Muramatsu et al. | |

* cited by examiner

*Primary Examiner*—Robert Pascal
*Assistant Examiner*—Levi Gannon
(74) *Attorney, Agent, or Firm*—Schmeiser, Olsen & Watts; Anthony J. Canale (57) ABSTRACT

An LC tack structure. The structure, including a set of wiring levels on top of a semiconductor substrate, the wiring levels stacked on top of each other from a lowest wiring level nearest the substrate to a highest wiring level furthest from the substrate; an inductor in the highest wiring level, the inductor confined within a perimeter of a region of the highest wiring level; and a varactor formed in the substrate, the varactor aligned completely under the perimeter of the region of the highest wiring level. The structure may additionally include an electric shield in a wiring level of the set of wiring levels between the lowest wiring level and the highest wiring level. Alternatively, the inductor includes a magnetic core and alternating electrically non-magnetic conductive metal coils and magnetic coils around the core.

21 Claims, 7 Drawing Sheets

VERTICAL LC TANK DEVICE

This application is a continuation of U.S. patent application Ser. No. 11/161,929 filed on Aug. 23, 2005 now U.S. Pat. No. 7,323,948.

FIELD OF THE INVENTION

The present invention relates to the field of LC tank devices for integrated circuits; more specifically, it relates to an LC tank device comprising an inductor and varactor on an integrated circuit chip.

BACKGROUND OF THE INVENTION

Conventional LC tank devices require a protected area within which the inductor portion of the LC tank device is placed and the varactor portion of the LC tank device or any other devices of integrated circuits of integrated circuit chips are excluded in order to avoid, eddy currents and electric field coupling to elements of the integrated circuits. Thus large regions of prime chip area are effectively wasted and the parasitic capacitances of the long metal connections over the protection area between the inductor and the varactor reduce the quality (Q) value and the frequency tuning range of the LC tank. The horizontal metal connections dominate the total connection parasitic capacitances. In order to recover these presently unused regions and improve the performances of the integrated circuit chip, a new LC tank device is required.

SUMMARY OF THE INVENTION

A first aspect of the present invention is a structure, comprising: a set of wiring levels on top of a semiconductor substrate, the wiring levels stacked on top of each other from a lowest wiring level nearest the substrate to a highest wiring level furthest from the substrate; an inductor in the highest wiring level, the inductor confined within a perimeter of a region of the highest wiring level; an electric shield in a wiring level of the set of wiring levels between the lowest wiring level and the highest wiring level; and a varactor formed in the substrate, the varactor aligned completely under the perimeter of the region of the highest wiring level.

A second aspect of the present invention is a structure, comprising: a set of wiring levels on top of a semiconductor substrate, the wiring levels stacked on top of each other from a lowest wiring level nearest the substrate to a highest wiring level furthest from the substrate; an inductor in the highest wiring level, the inductor confined within a perimeter of a region of the highest wiring level, the inductor comprising a magnetic core and alternating electrically non-magnetic conductive metal coils and magnetic coils around the core; and a varactor formed in the substrate, the varactor aligned completely under the perimeter of the region of the highest wiring level.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A common feature of the various embodiments of the present invention is elimination of the horizontal metal interconnections commonly found between elements of LC tank circuits of integrated circuit chips in order to minimize parasitic capacitances caused the horizontal metal connections.

Figure 1:
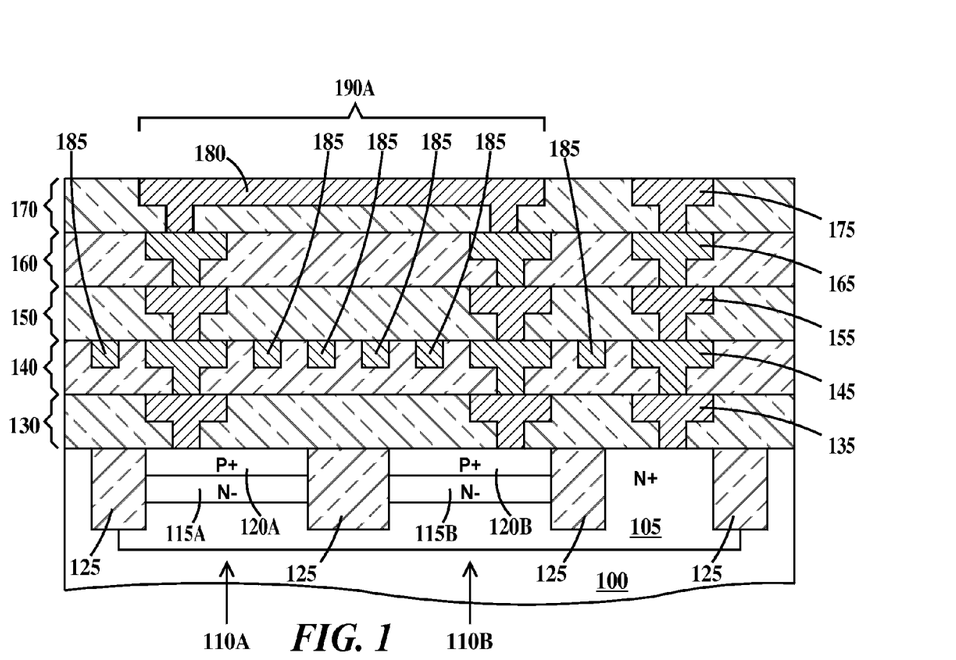
FIG. 1 is a cross-sectional view of an LC tank device according to a first embodiment of the present invention.

FIG. 1 is a cross-sectional view of an LC tank device according to a first embodiment of the present invention. Formed in a silicon substrate 100 (or a silicon layer on a silicon-on insulator (SOI) substrate) is an N-well region 105. Formed in N-well region 105 are varactors 110A and 110B. Varactor 110A comprises a lightly doped N-type region 115A between a highly doped P region 120A and the highly doped N-well 105. Varactor 110B comprises a lightly doped N-type region 115B between a highly doped P region 120B and the highly doped N-well 105. Regions 115A and 115B as well as regions 120A and 120B are isolated from each other by shallow trench isolation (STI) 125. Varactors 110A and 110B are examples of a typical p-n junction based varactor diode. Varactors 110A and 110B may be replaced with other varactor types such as hyper abrupt junction (HAVAR) varactors, MOS varactors (see FIG. 12).

Formed on top surface of substrate 105 is a first dielectric layer 130 which includes conductive metal vias 135. Formed on a top surface of first dielectric layer 130 is a second dielectric layer 140 which includes conductive metal vias 145. Formed on a top surface of second dielectric layer 140 is a third dielectric layer 150 which includes conductive metal vias 155. Formed on a top surface of third dielectric layer 150 is a fourth dielectric layer 160 which includes conductive metal vias 165. Formed on a top surface of fourth dielectric layer 160 is a fifth dielectric layer 170 which includes conductive metal vias 175. While five dielectric layers are illustrated in FIG. 1, there may be more or less than five dielectric layers. The combination of a dielectric layer and its corresponding electrically conductive wires and electrically conductive vias is also called a wiring level and the dielectric layer is also called an interlevel dielectric (ILD). Dielectric layers 130, 140, 150, 160 and 170 and wires contained in them thus comprise wiring levels, with the lowest wiring level closest to substrate 100 and the highest wiring level furthest away from the substrate.

Formed in fifth dielectric layer 170 is an inductor 180 and formed in second dielectric layer 140 is a patterned electric shield 185. Patterned electric shield 185 is aligned between inductor 180 and varactors 110A and 110B. A first set of vias 135, 145, 155, 165 and 175 provide a continuous electrical path to N-well 105. A second set of vias 135, 145, 155 and 175 provide a continuous electrical path to P region 120B of varactor 110B and a third set of vias 135, 145, 155 and 165 provide a continuous electrical path to P region 120A of varactor 110A. Thus an LC tank circuit 190A includes varactors 110A, 110B, inductor 180 and patterned electric shield 185. When wired, a varactor control signal ($V_{CTR}$ signal) is applied to N-well 105 and ground is applied to patterned electric shield 185.

Inductor 180 is advantageously place in the highest wiring level (that furthest away from substrate 100) in order to reduce parasitic capacitance and thus increase the Q factor of the inductor though the inductor may be placed in a lower wiring level. Patterned electric shield 185 is patterned (includes gaps filled with the dielectric material of dielectric layer 140) and is advantageously placed in a low wiring level (a wiring level near to varactors 110A and 110B) in order to reduce eddy currents though the patterned shield may be placed in a higher wiring level.

Figure 2:
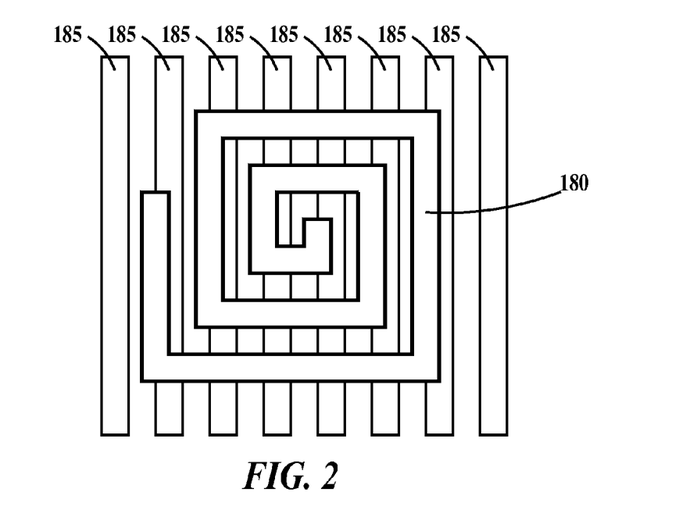
FIG. 2 is a plan view of portions of the LC tank device according to the first embodiment of the present invention.

FIG. 2 is a plan view of portions of the LC tank device according to the first embodiment of the present invention. In FIG. 2, it can be seen that inductor 180 has the shape of a spiral coil and patterned electric shield 185 comprises a set of parallel wires. Patterned electric shield 185 cannot shield a DC magnetic field because of the unity permeability of metal, but can stop an AC magnetic field when the shield is grounded by forcing the electric field to a constant value.

It should be noted, that varactors 110A and 110B are aligned within the perimeter defined by the outermost coils of inductor 185 and that patterned electric shield 185 overlaps the perimeter defined by the outermost coils of inductor 185. In one example, inductor 180 and patterned electric shield 185 comprise aluminum (Al) or copper (Cu) or liner of tantalum/tantalum nitride (Ta/TaN) filled with a core of Cu. Semiconductor devices such as diodes, transistors, resistors and capacitors may be formed in the substrate or in the dielectric layers directly below patterned electric shield 185.

Figure 3:
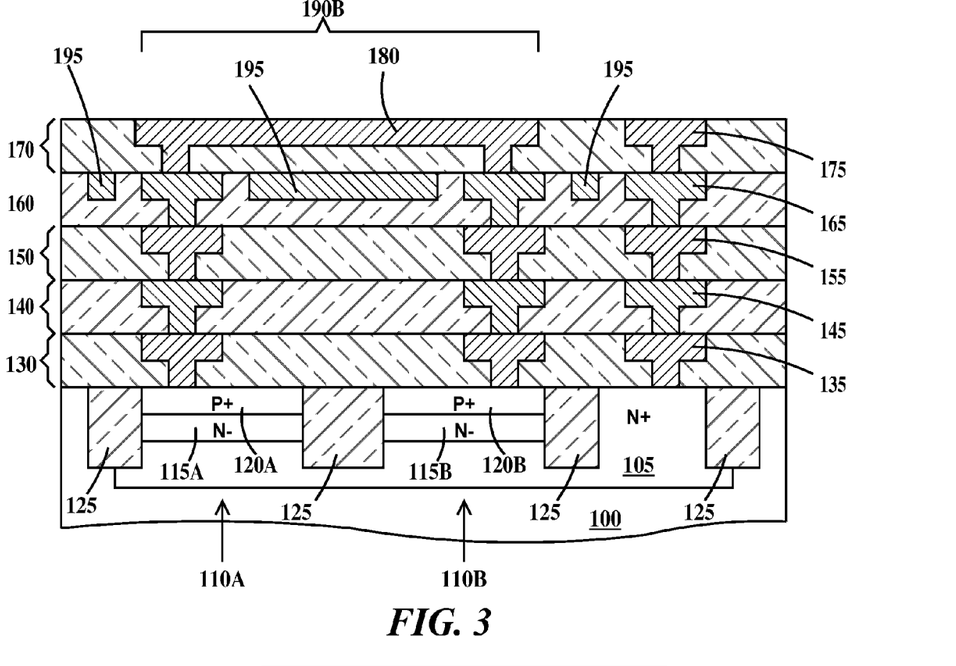
FIG. 3 is a cross-sectional view of an LC tank device according to a second embodiment of the present invention.

FIG. 3 is a cross-sectional view of an LC tank device according to a second embodiment of the present invention. FIG. 3 is similar to FIG. 1 except an LC tank device 190B includes a magnetic shield 195 in place of patterned electric shield 185 of FIG. 1. Magnetic shield 195 is formed in fourth dielectric layer 160. Magnetic shield 195 is a solid plate except for through holes for vias 165 and is advantageously placed in a high wiring level (a wiring level near to inductor 180) in order to maximize the number of wiring levels where normal integrated circuit wires may pass under the shield.

Figure 4:
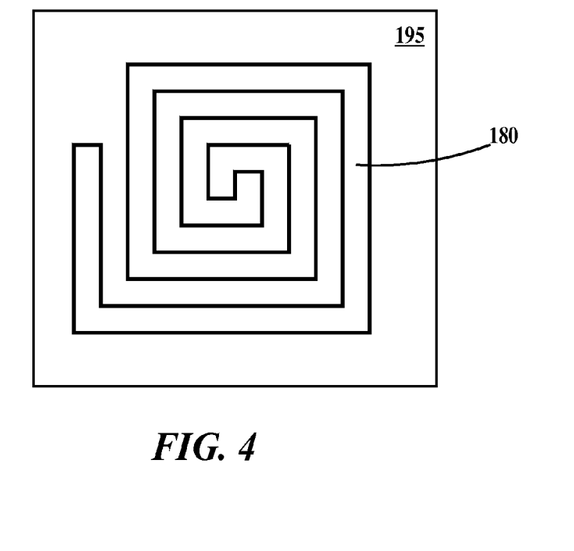
FIG. 4 is a plan view of portions of the LC tank device according to the second embodiment of the present invention.

FIG. 4 is a plan view of portions of the LC tank device according to the second embodiment of the present invention. In FIG. 4, it can be seen that inductor 180 has the shape of a spiral and magnetic shield 195 comprises a continuous region with no openings.

It should be noted, that varactors 110A and 110B are aligned within the perimeter defined by the outermost coils of inductor 180 and that magnetic shield 195 overlaps the perimeter defined by the outermost coils of inductor 180. In one example, inductor 180 comprise Al, Cu or a liner of Ta/TaN filled with a core of Cu and magnetic shield 195 comprises iron (Fe), nickel (Ni), Cu, molybdenum (Mo), manganese (Mn). $MnFe_2O_3$, $Cu\ Fe_2O_3$, $Zn\ Fe_2O_3$, $Ni\ Fe_2O_3$, other ferrites or other magnetic materials in either solid or paste form. Such magnetic materials and method of integrating them into integrated circuits is described in U.S. Patent Application Publication US2004/0263310 published on Dec. 30, 2004 which is hereby incorporated by reference in its entirety. Devices such as diodes, transistors, resistors and capacitors may be formed in the substrate or in the dielectric layers directly below magnetic shield 195.

Figure 5:
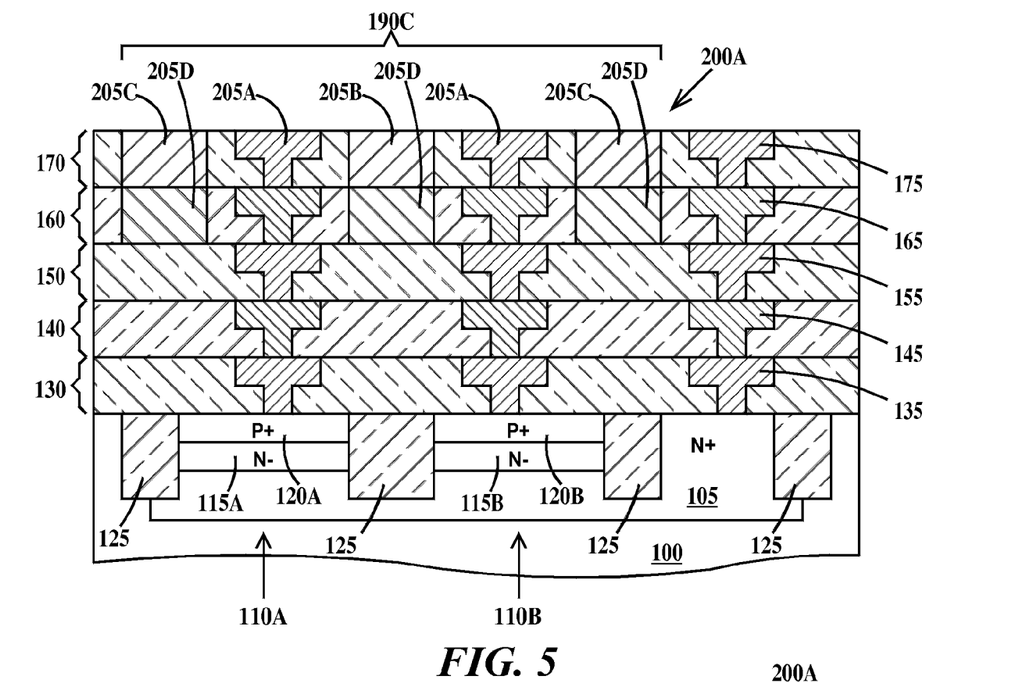
FIG. 5 is a cross-sectional view of an LC tank device according to a third embodiment of the present invention.

FIG. 5 is a cross-sectional view of an LC tank device according to a third embodiment of the present invention. FIG. 5 is similar to FIG. 1 except an LC tank device 190C includes a magnetic core inductor 200A in place of inductor 180 of FIG. 1 Magnetic core inductor 200A comprises a loop coil conductor 205A between an inner magnetic core 205B, an outer magnetic loop 205C and a magnetic plate 205D under loop coil conductor 205A, magnetic core 205B and outer magnetic loop 205C and there is no patterned shield. Magnetic plate 205D includes through holes for vias 165. Magnetic core inductor 200A is formed in fourth and fifth dielectric layers 160 and 170. Magnetic core inductor 200A is advantageously placed in the highest wiring levels (the wiring levels furthest from substrate 100) in order to maximize the number of wiring levels where normal integrated circuit wires may pass under inductor 200A. Loop conductor 205A inner magnetic core 205B, outer magnetic loop 205C in fifth dielectric layer 170 are not electrically connected to each other or physically contacting each other. Magnetic plate 205D in fourth dielectric layer 160 is in physical contact with inner magnetic core 205B and outer magnetic loop 205C.

Figure 6:
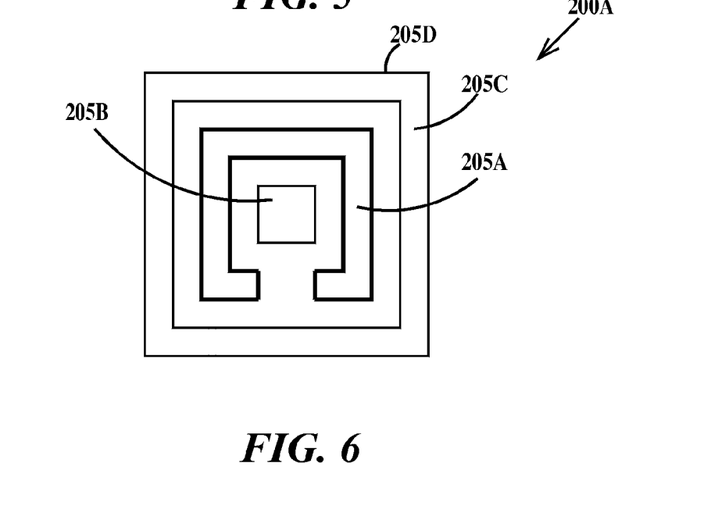
FIG. 6 is a plan view of portions of the LC tank device according to the third embodiment of the present invention.

FIG. 6 is a plan view of portions of the LC tank device according to the third embodiment of the present invention. In FIG. 6, it can also be seen that loop conductor 205A, inner magnetic core 205B, outer magnetic loop 205C are not electrically connected to each other or physically contacting each other.

It should be noted, that varactors 110A and 110B are aligned within the perimeter defined by the outermost coils of core inductor 200A. In one example, loop coil inductor 205A comprises Al, Cu or liner of Ta/TaN filled with a core of Cu and magnetic core 205B and magnetic loop coil 200C each comprise same materials described for magnetic shield 195 of FIGS. 3 and 4 and described supra. Devices such as diodes, transistors, resistors and capacitors may be formed in the substrate or in the dielectric layers directly below core inductor 205A.

Figure 7:
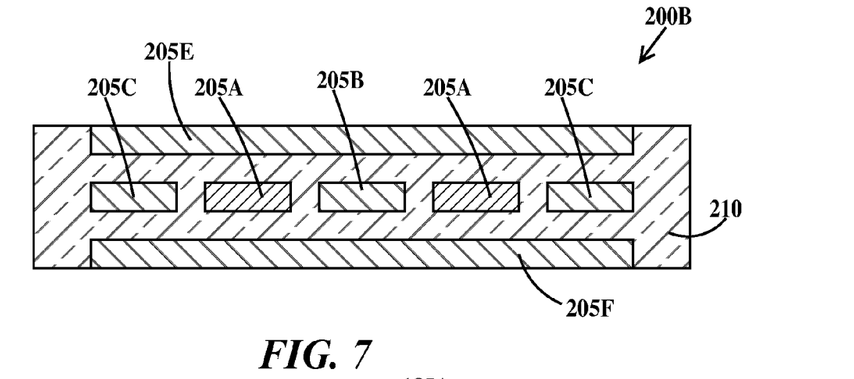
FIG. 7 is a cross sectional view of an alternative magnetic core inductor for use with the third embodiment of the present invention.

FIG. 7 is a cross sectional view of an alternative magnetic core inductor for use with the third embodiment of the present invention. In FIG. 7, a core inductor 200B comprises loop coil conductor 205A between inner magnetic core 205B and outer magnetic loop coil 205C in the same plane and between a upper magnetic plate 205E and a lower magnetic plate 205F, all embedded in a dielectric layer 210.

Figure 8A:
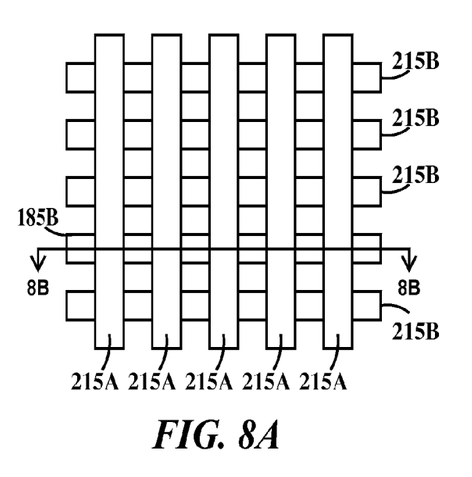
FIGS. 8A, 8B, 9, 10 and 11 are alternative configurations for isolation layers for use with the first embodiment of the present invention
Figure 8B:
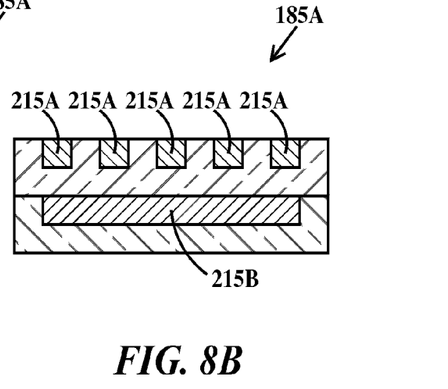

FIGS. 8A, 8B, 9, 10 and 11 are alternative configurations for shielding layers for use with the first embodiment of the present invention. FIG. 8B is a cross-section through line B-B of FIG. 8A. In FIGS. 8A and 8B, a patterned electric shield 185A includes a wires 215A in third dielectric layer 150 and wires 215B in second dielectric layer 140. Wires 215A are aligned perpendicular to e wires 215B.

Figure 9:
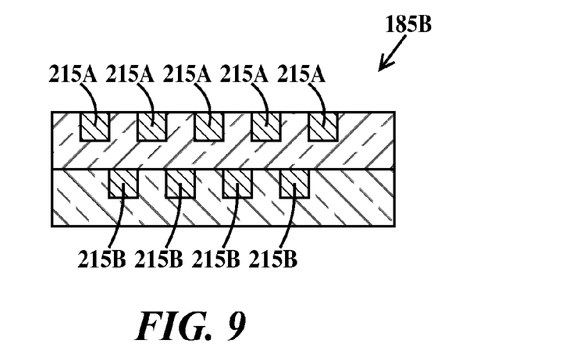

In FIG. 9, a patterned electric shield 185B is similar to patterned electric shield 185A of FIGS. 8A and 8B except wires 215A are aligned parallel to and horizontally (as defined by the planes of dielectric layers 140 and 150) offset from wires 215B.

Figure 10:
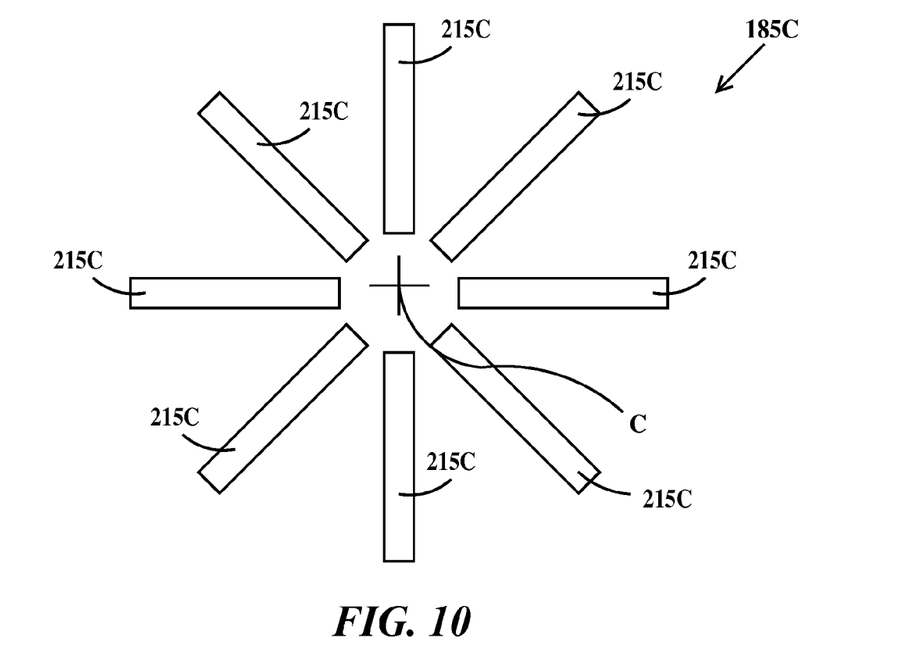

In FIG. 10, bars 215C of a patterned electric shield 185C are aligned radially around a central point "C" like the spokes of a wheel. There may be two sets of shields 185C, one in each of two adjacent dielectric layers and they may be aligned so corresponding bars 215C in each of the layers are aligned over each other or between each other.

Figure 11:
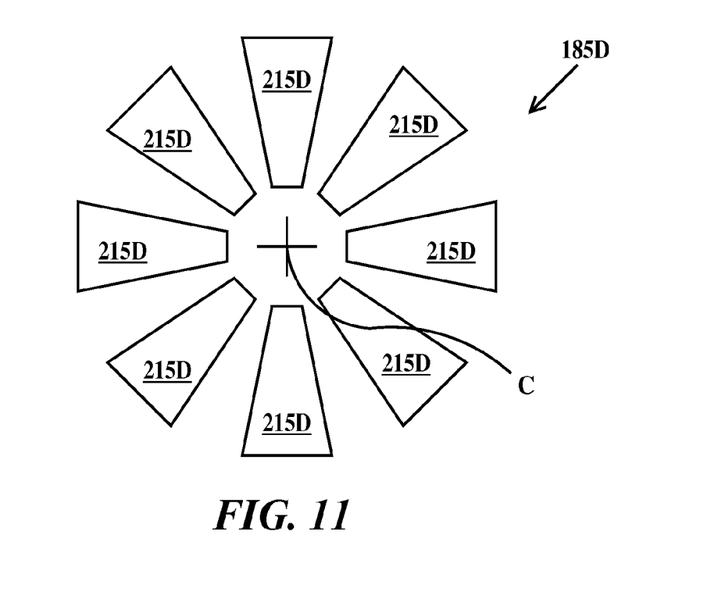

In FIG. 11, wedges 215D of a patterned electric shield 185C are aligned radially around central point "C" like the spokes of a wheel. There may be two sets of shields 185D, one in each of two adjacent dielectric layers and they may be aligned so corresponding wedges 215D in each of the layers are aligned over each other or between each other.

Figure 12:
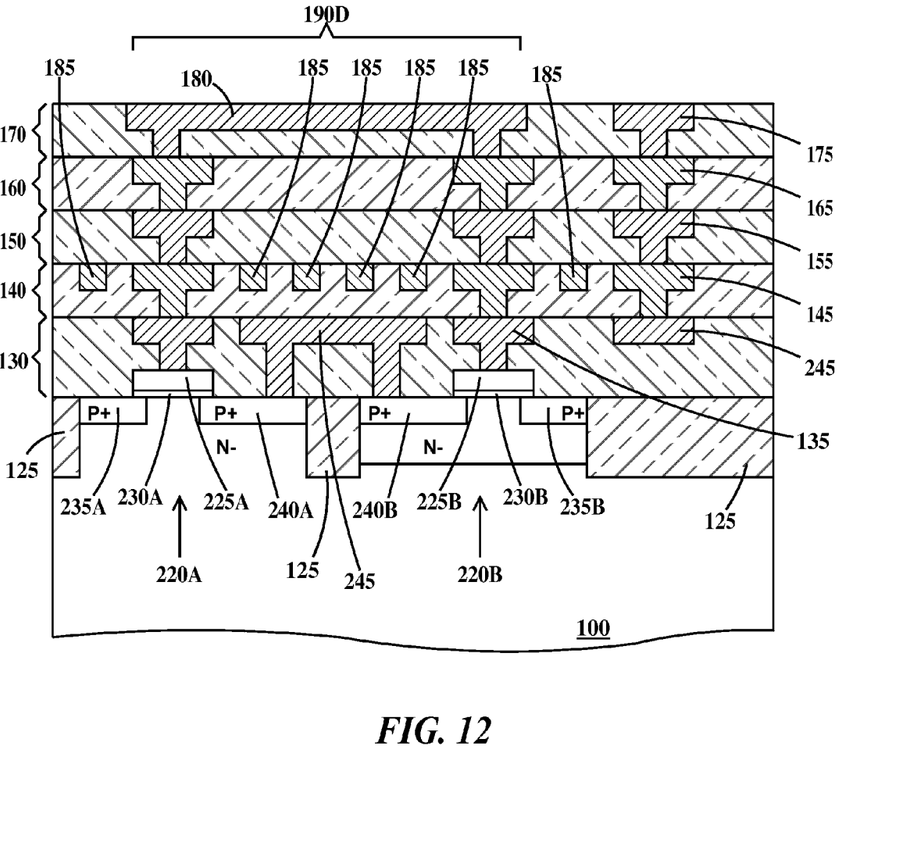
FIG. 12 is a cross-sectional view of an LC tank device according to the first embodiment of the present invention, but using an alternative varactor.

FIG. 12 is a cross-sectional view of an LC tank device according to the first embodiment of the present invention, but using an alternative varactor (e.g. a MOSVAR). In FIG. 12, a varactor 220A comprises the gate 225A, gate dielectric 230A, source/drain 235A and source/drain 240A of a first field effect transistor (FET) and varactor 220B comprises the gate 225B, gate dielectric 230B, source/drain 235B and source/drain 240B of a second FET. The $V_{CTR}$ signal described supra, is connected to source/drain 240A and source/drain 235B via wires 245 and vias 145, 155, 165 and 175. Varactors 220A and 220B may be used with all embodiments of the inductor and shielding of the present invention as illustrated in FIGS. 1, 2, 3, 4, 5, 6 7, 8A, 8B, 9, 10 and 11 and described supra.

The inductor of embodiments of the present invention may advantageously be used in a variety of integrated circuits including but not limited to PLL circuits, particularly the VCO circuit of PLL circuits as described infra.

Figure 13:
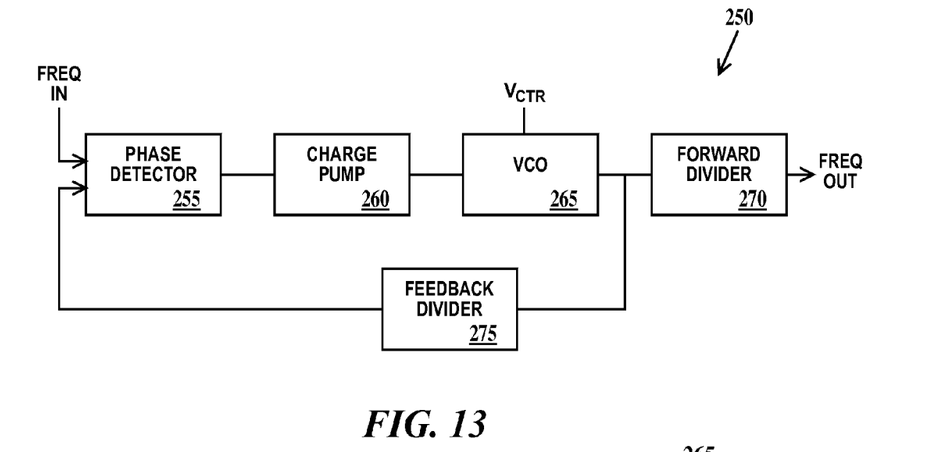
FIG. 13 is a schematic block diagram of a phase-lock-loop (PLL) circuit.

FIG. 13 is a schematic block diagram of a PLL circuit. In FIG. 13, a PLL circuit 250 includes a phase detector 255 connected to a charge pump 260 which in turn is connected to a VCO 265, which in turn is connected to a forward frequency divider 270. A feedback divider 275 is connected between forward frequency divider 270 and phase detector 255. An input frequency signal FREQ IN is connected to phase detector 255 and phase locked output frequency signal FREQ OUT is outputted by forward divide 270.

Figure 14:
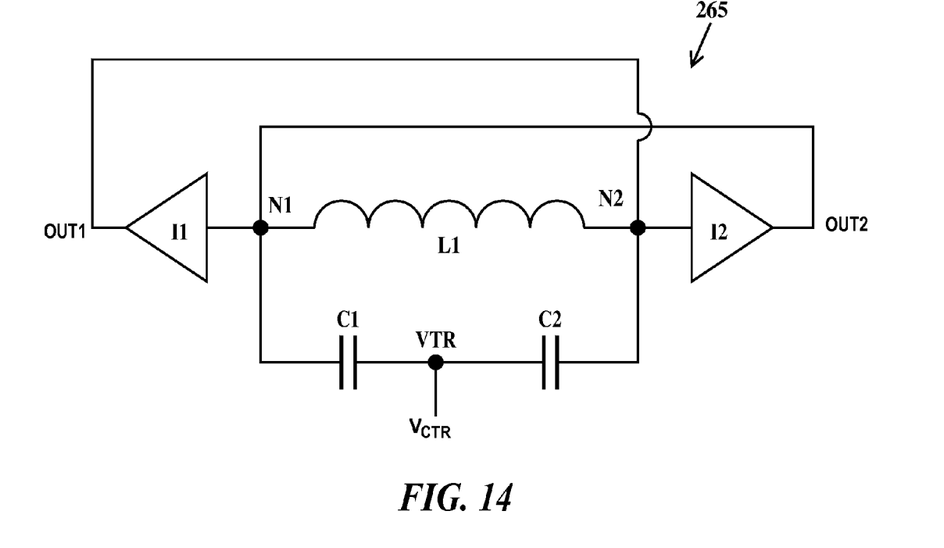
FIG. 14 is a circuit diagram of a voltage controlled oscillator (VCO) using an LC tank device according to the embodiments of the present invention.

FIG. 14 is a circuit diagram of a VCO using an LC tank device according to the embodiments of the present invention. In FIG. 14, VCO 265 comprises an inductor L1 connected between nodes N1 and N2. An input of a first inverter I1 is connected to node N1 and an input of a second inverter I2 is connected to node N2. A first plate of a capacitor C1 is connected to node N1 and a second plate of capacitor C1 is connected to a node VTR. A first plate of a capacitor C2 is connected to node N2 and a second plate of capacitor C2 is connected to node VTR. Capacitors C1 and C2 represent the varactors described supra. The output of inverters I1 is connected to N2 and the output of I2 is connected to N1.

Thus, the present invention provides an LC tank device in which the varactor portion of the LC tank circuit and other devices and wires of circuits of an integrated circuit chip may be placed under the inductor.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
   a set of wiring levels on top of a semiconductor substrate, said wiring levels stacked on top of each other from a lowest wiring level nearest said substrate to a highest wiring level furthest from said substrate, each wiring level of said set of wiring levels comprising an interlevel dielectric layer and electrically conductive wires embedded in their respective interlevel dielectric layers;
   an inductor in said highest wiring level and a next to highest wiring level of said set of wiring levels, a first portion of said inductor confined within a first perimeter of a region of said highest wiring level, said first portion comprising a single electrically conductive non-magnetic loop between an inner magnetic core and a single closed outer magnetic loop, a second portion of said inductor confined within a second perimeter of a region of said next to highest wiring level and comprising a magnetic plate, bottom surfaces of said magnetic core and said outer magnetic loop in physical contact with a top surface of said magnetic plate; and
   a varactor formed in said substrate, said varactor aligned completely under said first perimeter.

2. The structure of claim 1, further including;
   an integrated circuit, at least one semiconductor device of said integrated circuit formed in said substrate and aligned under said first perimeter.

3. The structure of claim 1, further including:
   an integrated circuit, at least one wire of said integrated circuit formed in a wiring level of said set of wiring levels between said highest wiring level and said substrate and passing under said first perimeter.

4. The structure of claim 1, wherein said varactor comprises diodes.

5. The structure of claim 1, wherein said varactor comprises FETs.

6. The structure of claim 1, wherein:
   said electrically conductive wires and said non-magnetic loop independently comprise aluminum, copper or a liner of tantalum/tantalum nitride filled with a core of copper; and
   said inner magnetic core, said outer magnetic loop and said magnetic plate independently comprise a magnetic material in either solid or paste form selected from the group consisting of iron, nickel, copper, molybdenum, manganese, $MnFe_2O_3$, $Cu Fe_2O_3$, $Zn Fe_2O_3$, $Ni Fe_2O_3$, and other ferrites.

7. The structure of claim 1, further including:
   openings in said magnetic plate;
   wires passing through said openings to connect said varactor to said non-magnetic loop coil conductor to said varactor.

8. The structure of claim 1 wherein said non-magnetic loop is an open loop having as gap in one side of said open loop.

9. The structure of claim 1, wherein:
   said first perimeter is defined by an outer perimeter of said outer magnetic loop; and
   said second perimeter is defined by an outer perimeter of said magnetic plate.

10. The structure of claim 9, wherein said first perimeter is aligned to said second perimeters in planes perpendicular to a top surface of said substrate.

11. The structure of claim 1, wherein said inner magnetic core, said non-magnetic loop, said outer magnetic loop and said magnetic plate each have at least one pair of parallel sides.

12. The structure of claim 1, wherein:
   top surfaces of said inner magnetic core, said non-magnetic loop, and said outer magnetic loop and an interlevel dielectric layer of said highest wiring level are coplanar;

bottom surfaces of said inner magnetic core, said non-magnetic loop, and said outer magnetic loop and of an interlevel dielectric layer of said next to highest wiring level are coplanar;

said top surface of said magnetic plate is coplanar with a top surface of an interlevel dielectric layer of said next to highest wiring level; and a bottom surface of said magnetic plate is coplanar with a bottom surface of said interlevel dielectric layer of said next to highest wiring level.

13. A structure, comprising:

a set of wiring levels on top of a semiconductor substrate, said wiring levels stacked on top of each other from a lowest wiring level nearest said substrate to a highest wiring level furthest from said substrate, each wiring level of said set of wiring levels comprising an interlevel dielectric layer and electrically conductive wires embedded in their respective interlevel dielectric layers;

an inductor in said wiring levels, said inductor comprising an upper magnetic plate in a first dielectric layer and a single electrically conductive non-magnetic loop between an inner magnetic core and a single closed outer magnetic loop in a third dielectric layer, and a bottom magnetic plate in a fifth dielectric layer, said first and third dielectric layers separated by a second dielectric layer, said third and fifth layers separated by a fourth dielectric layer; and a varactor formed in said substrate, said varactor aligned completely under said inductor.

14. The structure of claim 13, further including;

an integrated circuit, at least one semiconductor device of said integrated circuit formed in said substrate and aligned under a perimeter defined by a perimeter of said outer magnetic loop.

15. The structure of claim 13, further including:

an integrated circuit, at least one wire of said integrated circuit formed in a wiring level of said set of wiring levels below said highest wiring level and passing under a perimeter defined by a perimeter of said outer magnetic loop.

16. The structure of claim 13, wherein said varactor comprises diodes.

17. The structure of claim 13, wherein said varactor comprises FETs.

18. The structure of claim 13, wherein:

said electrically conductive wires and said non-magnetic loop independently comprise aluminum, copper or a liner of tantalum/tantalum nitride filled with a core of copper; and said inner magnetic core, said outer magnetic loop, said upper magnetic plate and said lower magnetic plate independently comprise a magnetic material in either solid or paste form selected from the group consisting of iron, nickel, copper, molybdenum, manganese, $MnFe_2O_3$, $Cu Fe_2O_3$, $Zn Fe_2O_3$, $Ni Fe_2O_3$, and other ferrites.

19. The structure of claim 13, wherein:

top surfaces of said inner magnetic core, said non-magnetic loop, and said outer magnetic loop and an interlevel dielectric layer of said highest wiring level are coplanar;

said bottom surfaces of said inner magnetic core, said non-magnetic loop, and said outer magnetic loop and a bottom surface of said interlevel dielectric layer of said highest wiring level are coplanar;

top surfaces of said upper magnetic plate and said first dielectric layer are coplanar and bottom surfaces of said upper magnetic plate and said first dielectric layer are coplanar; and top surfaces of said lower magnetic plate and said fifth dielectric layer are coplanar and bottom surfaces of said lower magnetic plate and said fifth dielectric layer are coplanar.

20. The structure of claim 13, wherein:

a first perimeter defined by an outer perimeter of said upper magnetic plate, a second perimeter defined by an outer perimeter of said outer magnetic loop, and a third perimeter is defined by an outer perimeter of said lower magnetic plate are aligned to each other in planes perpendicular to a top surface of said substrate.

21. The structure of claim 13, wherein said upper plate, said inner magnetic core, said non-magnetic loop, said outer magnetic loop and said lower magnetic plate each have at least one pair of parallel sides.

* * * * *